United States Patent
Sohn et al.

(10) Patent No.: US 11,616,484 B2
(45) Date of Patent: Mar. 28, 2023

(54) BAND ANTENNA EMP FILTER APPARATUS HAVING HEMP PROTECTION CAPABILITY

(71) Applicant: AGENCY FOR DEFENSE DEVELOPMENT, Daejeon (KR)

(72) Inventors: Juhang Sohn, Daejeon (KR); Kyoungje Park, Daejeon (KR); Yongwoo Park, Daejeon (KR); Donghyeok Lee, Daejeon (KR); Jungsup Kim, Daejeon (KR); Kilsoo Jeong, Daejeon (KR); Jaehyun Park, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 38 days.

(21) Appl. No.: 17/323,798

(22) Filed: May 18, 2021

(65) Prior Publication Data

US 2022/0209735 A1 Jun. 30, 2022

(30) Foreign Application Priority Data

Dec. 30, 2020 (KR) .......................... 10-2020-0188239

(51) Int. Cl.
*H03H 7/01* (2006.01)
*H02H 3/20* (2006.01)
*H02H 9/04* (2006.01)

(52) U.S. Cl.
CPC ............ *H03H 7/0138* (2013.01); *H02H 3/20* (2013.01); *H02H 9/04* (2013.01); *H03H 7/0115* (2013.01); *H03H 7/175* (2013.01); *H03H 7/1775* (2013.01)

(58) Field of Classification Search
CPC ............... H03H 7/0138; H03H 1/0007; H03H 7/0115; H02H 1/0061; H02H 3/20; H02H 9/042

(Continued)

(56) References Cited

U.S. PATENT DOCUMENTS

| 5,966,283 A | * | 10/1999 | Glaser ...................... H01Q 1/50 361/120 |
|---|---|---|---|
| 8,179,655 B2 | | 5/2012 | Wedley |
| 2019/0067772 A1 | | 2/2019 | Dakhiya et al. |

FOREIGN PATENT DOCUMENTS

| JP | 11206012 A | 7/1999 |
|---|---|---|
| KR | 101438122 B1 | 9/2014 |
| KR | 101872325 B1 | 6/2018 |

OTHER PUBLICATIONS

2020 High Power Electromagnetic Pulse (EMP) Response Technology Spread Seminar and its English Translation.

(Continued)

*Primary Examiner* — Rakesh B Patel

(74) *Attorney, Agent, or Firm* — Dickinson Wright PLLC

(57) ABSTRACT

A band antenna EMP filter apparatus having HEMP protection capability is disclosed. The apparatus includes a discharging part, a band pass filtering part, and a residual current eliminating part. The discharging part primarily discharges a transient voltage due to a high altitude electromagnetic pulse (HEMP) when the HEMP is inputted through an input part receiving a radio frequency (RF) signal of an antenna. The band pass filtering part secondarily blocks a residual current primarily discharged by the discharging part and passes only a signal of a preset frequency band to output it through an output part. The residual current eliminating part limits a transient voltage of the HEMP by eliminating a residual current passing through the band pass filtering part.

10 Claims, 8 Drawing Sheets

(58) Field of Classification Search
USPC .................................. 361/119; 333/175, 181
See application file for complete search history.

(56) References Cited

OTHER PUBLICATIONS

2020 Korea Institute of Military Science and Technology Online General Conference and its English Translation.

* cited by examiner

BAND ANTENNA EMP FILTER APPARATUS HAVING HEMP PROTECTION CAPABILITY

RELATED APPLICATIONS

This application claims priority to and the benefit of Korean Patent Application No. 10-2020-0188239 filed in the Korean Intellectual Property Office on Dec. 30, 2020, the entire contents of which are incorporated herein by reference.

FIELD

The present disclosure relates to a band antenna EMP filter apparatus having HEMP protection capability, and more particularly, to a band antenna EMP filter apparatus having HEMP protection capability in which an RF antenna line may be superior to a filter for an antenna at a level of lightning protection and satisfy an MIL-STD-188-125 acceptance criterion.

BACKGROUND

Recently, a threat of a high-power electromagnetic pulse (EMP) is increasing, and particularly, a threat of high altitude electromagnetic pulse (HEMP) that explodes at a high altitude and paralyzes a wide range of electric and electronic devices in an instant is increasing.

A path of the high-power electromagnetic pulse threat is classified into a radiative path that propagates into the air and a conductive path that is applied to an electrical path such as a power source, a signal, and an RF line.

With development of an electronic device-based society, importance of protection against HEMP has emerged, and facilities therefor are being mainly introduced in the defense and public sectors.

A constructed HEMP protection facility is being evaluated for its performance by citing a standard (MIL-STD-188-125) of the US Department of Defense. Since the threat may damage not only the facilities but also the military's information communication system, and cause disruption of communication and paralysis of the command system, protection measures therefor are urgent.

A general HEMP protection method for the radiant path is to shield electromagnetic pulses from being transmitted through, and a HEMP protection method for the conductive path is to filter a high current by using a high voltage discharging element.

Meanwhile, a radio frequency (RF) coaxial cable has a structure surrounded by a metal mesh and a central core that receives a signal from an antenna removes a HEMP component by using a filter, and when the signal must be introduced into a device, damage to the equipment may be prevented.

In order to protect the equipment from the threat of HEMP, a number of HEMP filters for power and signals have been developed in Korea and abroad, but since the RF filter must have a strict tolerance standard and a low degradation characteristic of the communication signal, it is difficult to develop it, and although demand for RF EMP filters is increasing, only products with a level of lightning protection have currently been developed.

The above information disclosed in this Background section is only for enhancement of understanding of the background of the disclosure, and therefore it may contain information that does not form the prior art that is already known in this country to a person of ordinary skill in the art.

BRIEF SUMMARY

The present disclosure has been made in an effort to a band antenna EMP filter apparatus having HEMP protection capability that may minimize (≤0.5 dB) deterioration of a communication signal while a high frequency (HF) band RF antenna line of a military's combat radio equipment may satisfy the MIL-STD-188-125 tolerance standard as well as an antenna filter of a lightning protection level.

In order to achieve the object of the present disclosure as described above and to realize the characteristic effect of the present disclosure described later, the characteristic configuration of the present disclosure is as follows.

An embodiment of the present disclosure provides an EMP filter apparatus, including: a discharging part primarily discharging a transient voltage due to a high altitude electromagnetic pulse (HEMP) when the HEMP is inputted through an input part receiving a radio frequency (RF) signal of an antenna; a band pass filtering part that secondarily blocks a residual current primarily discharged by the discharging part and passes only a signal of a preset frequency band to output it through an output part; and a residual current eliminating part that limits a transient voltage of the HEMP by eliminating a residual current passing through the band pass filtering part.

The discharging part primarily limits the transient current by discharging a transient voltage due to the HEMP by using a gas discharging tube.

The band pass filtering part includes a band pass filter configured of a plurality of LC circuits disposed in series between the discharging part and the output part.

The plurality of LC circuits include a first LC circuit connected to the discharging part, a second LC circuit connected to the first LC circuit, and a third LC circuit connected to the second LC circuit, and the LC circuit is a circuit in which an inductor and a capacitor are connected in series.

The residual current eliminating part includes: a plurality of residual current eliminating circuits respectively connected between the plurality of LC circuits and the ground; and the residual current eliminating circuit includes a first residual current eliminating circuit connected between a first connection point connecting the first LC circuit and the second LC circuit and the ground, and a second residual current eliminating circuit connected between a second connection point connecting the second LC circuit and the third LC circuit and the ground.

Each of the plurality of residual current eliminating circuits includes: a plurality of first high-speed switching diodes connected in series between a connection point between the plurality of LC circuits and the ground and a first capacitor connected between one of the plurality of first high-speed fast switching diodes and the ground; and a plurality of second high-speed switching diodes connected in series between a connection point between the plurality of LC circuits and the ground and a second capacitor connected between one of the plurality of second high-speed fast switching diodes and the ground, and the plurality of second high-speed switching diodes have opposite bias directions to the plurality of first high-speed switching diodes.

The plurality of first high-speed switching diodes are turned on and operated when a positive HEMP is inputted to the plurality of LC circuits, and the plurality of second high-speed switching diodes are turned on and operated when a negative HEMP is inputted to the plurality of LC circuits, so that the transient voltage is limited so that a voltage applied to the plurality of LC circuits does not exceed a threshold voltage of the plurality of high-speed switching diodes.

The first capacitor is disposed between the first high-speed switching diode and the ground to prevent output loss when an output of a threshold voltage or more is inputted to the plurality of first high-speed switching diodes, and the second capacitor is disposed between the second high-speed switching diode and the ground to prevent output loss when an output of a threshold voltage or more is inputted to the plurality of second high-speed switching diodes.

Each of the plurality of residual current eliminating circuits further includes an inductor and a capacitor connected in parallel between a connection point between the plurality of LC circuits and the ground.

The first high-speed switching diode and the second high-speed switching diode are low leakage current type of diodes in unit of pF or less, and the first capacitor and the second capacitor are high-capacity capacitors in a unit of uF.

The discharging part, the band pass filtering part, and the residual current eliminating part are implemented on a substrate in a housing with a shielding structure to eliminate influence of a HEMP entering from the outside through a space that is a radiant path.

Capacitors included in the band pass filtering part and the residual current eliminating part are leadless surface-mount device (SMD) type of multilayer ceramic capacitors (MLCC) to minimize parasitic components, and inductors included therein are air core inductors with a constant inductor value even at high frequencies.

According to the present disclosure, it is possible to minimize 0.5 dB deterioration of a communication signal while a high frequency (HF) band RF antenna line of military combat radio equipment may satisfy the MIL-STD-188-125 tolerance standard as well as an antenna filter of a lightning protection level.

In addition, when a HEMP is inputted to an RF line of a radio through an antenna, by effectively limiting a transient current and a transient voltage caused by a HEMP current and thus minimizing an effect on an RF signal, it is possible to protect equipment and ensure operation of a military tactical radio.

Further, when a band antenna EMP filter with HEMP protection capability is installed and operated between an antenna and a radio in a network, it is possible to prevent failure accidents caused by a HEMP and similar transient voltages and transient currents and it is possible to stably operate a network radio.

DETAILED DESCRIPTION

Figure 1:
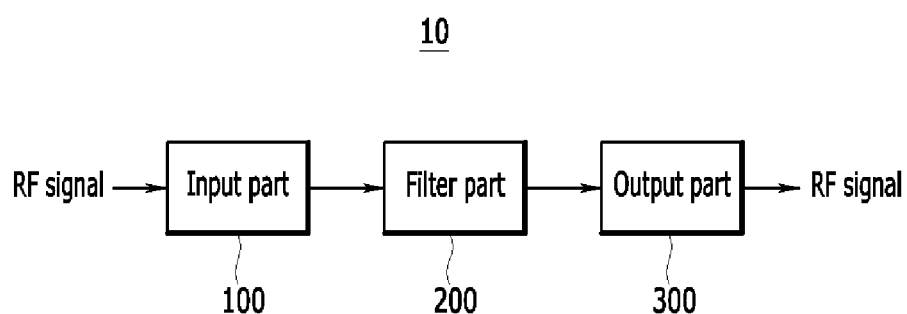
FIG. 1 illustrates a schematic block diagram of a band antenna EMP filter apparatus according to an embodiment of the present disclosure.

The present disclosure will be described more fully hereinafter with reference to the accompanying drawings, in which embodiments of the disclosure are shown. As those skilled in the art would realize, the described embodiment may be modified in various different ways, all without departing from the spirit or scope of the present disclosure.

In order to clearly describe the present disclosure, parts that are irrelevant to the description are omitted, and identical or similar constituent elements throughout the specification are denoted by the same reference numerals.

In addition, unless explicitly described to the contrary, the word "comprise" and variations such as "comprises" or "comprising" will be understood to imply the inclusion of stated elements but not the exclusion of any other elements.

Hereinafter, a band antenna EMP filter apparatus having HEMP protection capability according to an embodiment of the present disclosure will be described with reference to the accompanying drawings.

FIG. 1 illustrates a schematic block diagram of a band antenna EMP filter apparatus according to an embodiment of the present disclosure.

As shown in FIG. 1, a band antenna EMP filter apparatus 10 according to an embodiment of the present disclosure includes an input part 100, a filter part 200, and an output part 300.

The input part 100 receives a RF signal inputted to an antenna (not shown) through an RF connector to transmit it to the filter part 200. In this case, the input part 100 may use a 50 ohm RF connector or the like so that loss does not occur when the RF signal is received.

The filter part 200 performs band pass filtering for passing only a desired frequency band with respect to the RF signal transmitted through the input part 100 and then outputs it to the output part 300.

When a HEMP signal is introduced through the input part 100, the filter part 200 primarily discharges a transient voltage, and the transient current and voltage after the transient voltage is primarily discharged is discharged are additionally blocked, so that a residual current does not exceed a predetermined threshold current. Here, the predetermined threshold current may be, for example, 1A, which represents a current that satisfies MIL-STD-188-125 of a pulsed current injection (PCI) standard.

The output part 300 provides an RF signal outputted by limiting the transient voltage and the transient current from the filter part 200 to a predetermined level as an antenna output signal. In this case, the output part 300 may use a 50 ohm RF connector or the like so that loss does not occur when the RF signal is outputted.

Figure 2:
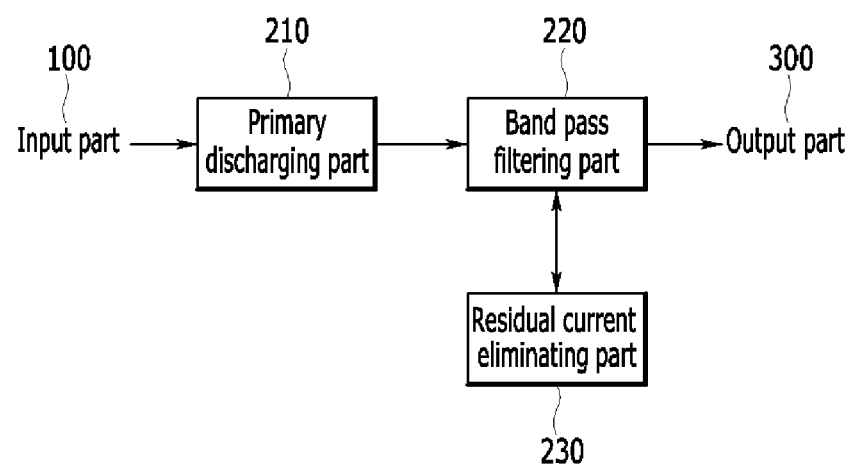
FIG. 2 illustrates a block diagram of a detailed configuration of a filter part shown in FIG. 1.
Figure 3:
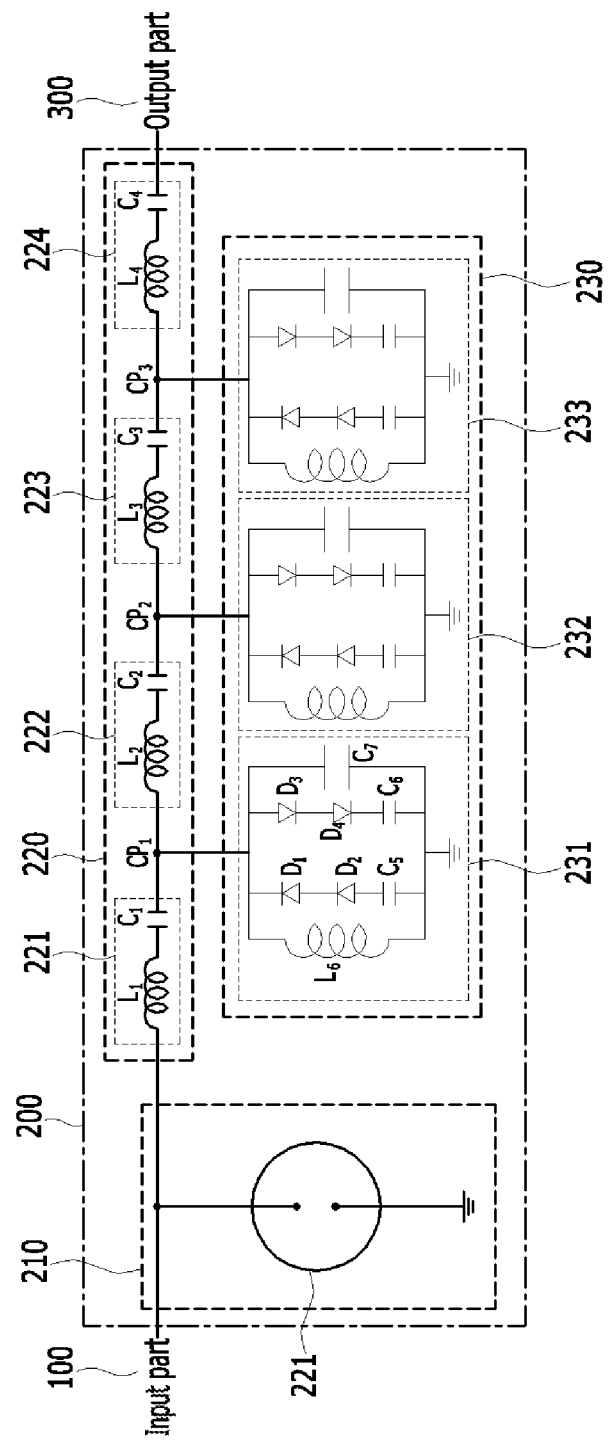
FIG. 3 illustrates an exemplary circuit diagram of the filter part shown in FIG. 2.

FIG. 2 illustrates a block diagram of a detailed configuration of the filter part 200 shown in FIG. 1, and FIG. 3 illustrates an exemplary circuit diagram of the filter part 200 shown in FIG. 2.

As shown in FIG. 2 and FIG. 3, the filter part 200 includes a primary discharging part 210, a band pass filtering part 220, and a residual current eliminating part 230.

The primary discharging part 210 serves to primarily discharge a transient voltage when a HEMP signal is inputted through the input part 100.

Referring to FIG. 3, one side of the primary discharging part 210 is connected to the input part 100, and the other side thereof is provided with a gas discharge tube (GDT) 211 that is grounded. The gas discharging tube 211 is operated when the transient current caused by the HEMP is inputted from the input part 100, and serves to transmit the transient current to the ground, thereby primarily discharging the transient voltage to block the transient current and the transient voltage.

The band pass filtering part 220 passes only a signal of a desired frequency bandwidth of the signal that has passed through the primary discharging part 210, and performs band pass filtering for attenuating a signal of other bandwidths thereof.

In addition, when the HEMP of which transient current and voltage are primarily blocked is inputted through the primary discharging part 210, the band pass filtering part 220 additionally blocks the transient current and voltage. That is, the band pass filtering part 220 may output a stable RF signal to the output part 300 by blocking the transient current and the transient voltage that are primarily blocked through the primary discharging part 210 by using a band pass filter (BPF).

Referring to FIG. 3, the band pass filtering part 220 includes a plurality of LC circuits connected in series between one side of the gas discharging tube 211 connected to the input part 100 and the output part 300, for example, four LC circuits 221, 222, 223, and 224. That is, one side of a first LC circuit 221 is directly connected to the input part 100, and the other side thereof is connected to one side of a second LC circuit 222; the other side of the second LC circuit 222 is connected to one side of a third LC circuit 223; the other side of the third LC circuit 223 is connected to one side of a fourth LC circuit 224; and the other side of the fourth LC circuit 224 is connected to the output part 300.

As shown in FIG. 3, each of the above-described four LC circuits 221, 222, 223, or 224 includes one inductor L1, L2, L3, or L4 and one capacitor C1, C2, C3, or C4, but the present disclosure is not limited thereto.

Each of the above-described four LC circuits 221, 222, 223, or 224 acts as a filter of a corresponding frequency band according to inductance of one inductor L1, L2, L3, or L4 and capacitance of one capacitor C1, C2, C3, or C4. Therefore, by appropriately setting the values of the inductance of the four inductors L1, L2, L3, and L4 and the values of the capacitance of the four capacitors C1, C2, C3, and C4 included in the four LC circuits 221, 222, 223, and 224, a frequency band of a signal to be passed by the band pass filtering part 220 may be set.

In addition, the band pass filtering part 220 is composed of the four LC circuits 221, 222, 223, and 224 as described above, so that the transient current and the transient voltage that are primarily blocked through the primary discharging part 210 may be additionally blocked. Accordingly, in order to prevent a current of a signal outputted through the output part 300 from exceeding 1A, which is the preset threshold current, the values of the inductance of the four inductors L1, L2, L3, and L4 and the values of the capacitance of the four capacitors C1, C2, C3, and C4 configuring the four LC circuits 221, 222, 223, and 224 may also be set and applied.

As an example, in a case of an EMP filter apparatus in HF and very high frequency (VHF) bands, the inductors L1 and L3 of the first LC circuit 221 and the second LC circuit have the same inductance, which is, for example, 15 nH, and the capacitors C1 and C3 thereof also have the same capacitance, which is, for example, 470 nF. In addition, the inductors L2 and L4 of the second LC circuit 221 and the fourth LC circuit have the same inductance, which is, for example, 50 nH, and the capacitors C2 and C4 thereof have the same capacitance, which is, for example, 470 nF.

The residual current eliminating part 230 is connected to the band pass filtering part 220, and it eliminates the residual current to limit an excessive voltage due to the residual current when the signal that has passed through the primary discharging part 210 passes through the band pass filtering part 220.

Referring to FIG. 3, one side of the residual current eliminating part 230 is connected between the plurality of LC circuits included in the band pass filtering part 220, for example, the four LC circuits 221, 222, 223, and 224, and the other side thereof includes a plurality of residual current eliminating circuits that are grounded, for example three residual current eliminating circuits 231, 232, and 233. Specifically, one side of the first residual current eliminating circuit 231 is connected to a connection point CP1 between the first LC circuit 221 and the second LC circuit 222, and the other side is thereof grounded; one side of the second residual current eliminating circuit 232 is connected to a connection point CP2 between the second LC circuit 222 and the third LC circuit 223, and the other side thereof is grounded; and one side of the third residual current eliminating circuit 233 is connected to a connection point CP3 between the third LC circuit 223 and the fourth LC circuit 224, and the other side thereof is grounded.

Meanwhile, since the three residual current eliminating circuits 231, 232, and 233 have the same configuration, only the first residual current eliminating circuit 231 will be specifically described here for convenience of description.

The first residual current eliminating circuit 231 includes: a pair of diodes, that is, two high-speed switching diodes D1 and D2, connected in series between the connection point CP1 between the first LC circuit 221 and the second LC circuit 222 and the ground; a capacitor C5 connected between the high-speed switching diode D2 and the ground; a pair of diodes, that is, two high-speed switching diodes D3 and D4 connected in series between the connection point CP1 and the ground; a capacitor C6 connected between the high-speed switching diode D4 and the ground; and an inductor L5 and a capacitor C7 connected between the connection point CP1 and the ground, respectively. Here, the high-speed switching diodes D1 and D2 and the high-speed switching diodes D3 and D4 have opposite bias directions. In addition, low leakage current diodes of several pF or less may be used as the four high-speed switching diodes D1, D2, D3, and D4, and capacitors of several uF may be used as the capacitors C6 and C7.

Hereinafter, an operation of the band antenna EMP filter apparatus 10 according to the embodiment of the present disclosure configured as described above will be described.

Referring to FIG. 1 to FIG. 3, when a HEMP is inputted through the input part 100 to which an RF signal is inputted, the gas discharging tube (GDT) 211 of the primary discharging part 210 operates so that the transient current flows to the ground to discharge the transient voltage, thereby primarily blocking the transient current and the transient voltage.

When a HEMP after the transient current and the transient voltage are primarily blocked by the primary discharging part 210 is inputted to the band pass filtering part 220, the four LC circuits 221, 222, 223, and 224 connected in series to configure a band pass filter in the band pass filtering part 220 pass an RF signal of a desired frequency band, and at the same time, additionally block the transient current and the transient voltage of the HEMP primarily blocked by the primary discharging part 210.

As describe above, while the transient current and the transient voltage are additionally blocked while the HEMP passing through the band pass filtering part 220, the residual current that passes through the band pass filtering part 220 after being primarily blocked in the primary discharging part 210, by the three residual current eliminating circuits 231, 232, and 233 connected between the four LC circuits 221, 222, 223, 224 of the band pass filtering part 220, is eliminated, so that the transient voltage of the HEMP passing through the band pass filtering part 220 is limited.

Specifically, in the case of the first residual current eliminating circuit 231, when a positive (+) HEMP is inputted to the connection point CP1 between the first LC circuit 221 and the second LC circuit 222, the high-speed switching diodes D3 and D4 are turned on and operated, and when a negative (−) HEMP is inputted to the connection point CP1, the high-speed switching diodes D1 and D2 are turned on and operated. Meanwhile, in the case of the high-speed switching diodes D1, D2, D3, and D4, when an output of the diode threshold voltage or more is inputted, output loss occurs, but in the first residual current eliminating circuit 231, since an impedance value is increased due to large-capacity capacitors C5 and C6 of several uF connected in series to the high-speed switching diodes D2 and D4, no output loss occurs.

In addition, the inductor L5 and the capacitor C7 are a band passing filter, and perform a function of additionally blocking the transient current and voltage that are primarily blocked through the primary discharging part 210.

The remaining two residual current eliminating circuits, that is, the second residual current eliminating circuit 232 and the third residual current eliminating circuit 233, operate in the same function as the first residual current eliminating circuit 231 described above. Specifically, the second residual current eliminating circuit 232 limits the transient voltage of the HEMP applied to the connection point CP2 between the second LC circuit 222 and the third LC circuit 223, and the third residual current eliminating circuit 233 limits the transient voltage of the HEMP applied to the connection point CP3 between the third LC circuit 223 and the fourth LC circuit 224.

As described above, when the HEMP flows into only a residual current eliminating circuit of one stage, for example, only the primary residual current erasing circuit 231, since it does not satisfy the residual current of 1 A or less of MIL-STD-188-125 of the PCI standard, the three residual current eliminating circuits 231, 232, and 233 are used to additionally reduce the residual current by additionally blocking the transient voltage.

As described above, in the embodiment of the present disclosure, through setting standards of various elements included in the primary discharging part 210, the band pass filtering part 220, and the residual current eliminating part 230, the residual current outputted through the output part 300 may be controlled so that it does not exceed 1 A.

Figure 4:
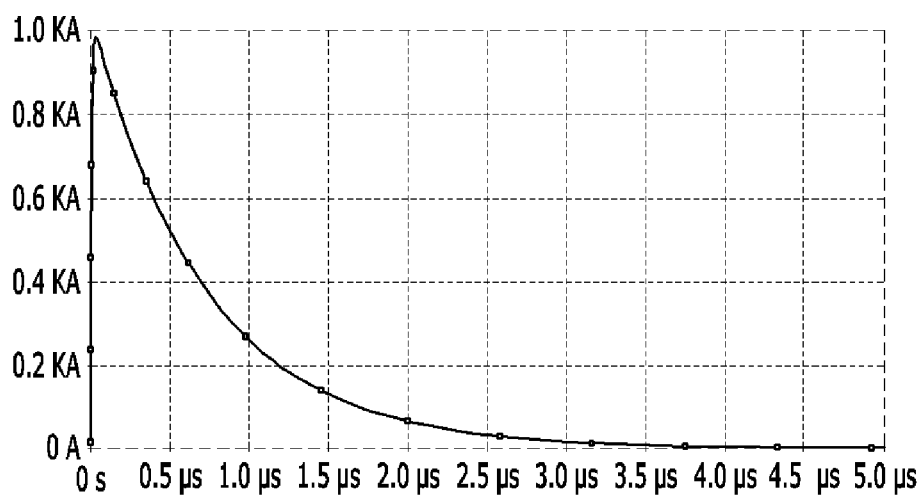
FIG. 4 illustrates an example of a PCI reference pulse of 1 kA inputted to a band antenna EMP filter apparatus according to an embodiment of the present disclosure.
Figure 5:
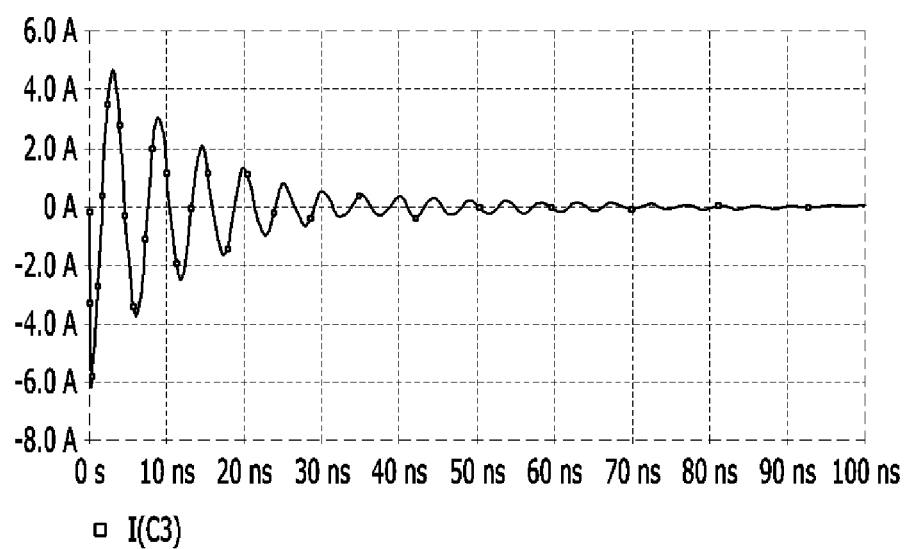
FIG. 5 illustrates an example of a residual current after primary discharge in a band antenna EMP filter apparatus according to an embodiment of the present disclosure.
Figure 6:
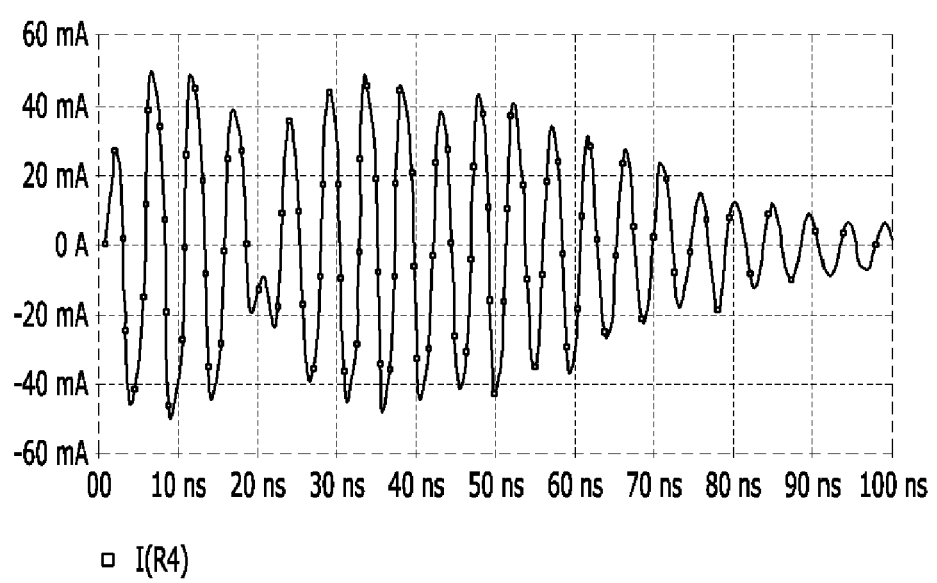
FIG. 6 illustrates an example of a residual current finally outputted from a band antenna EMP filter apparatus according to an embodiment of the present disclosure.

For example, an example of the PCI reference pulse of 1 kA for the HEMP inputted through the input part 100 of the band antenna EMP filter apparatus 10 according to the embodiment of the present disclosure is shown in FIG. 4. In addition, an example of the residual current value after the pulse as shown in FIG. 4 is inputted to the primary discharging part 210 through the input part 100 to be primarily discharged is shown in FIG. 5. Referring to FIG. 5, it can be seen that the PCI reference pulse of 1 kA has been reduced to a residual current value of about 6 A. Thereafter, an example of the value of the residual current of the pulse in which after the pulse passing through the primary discharging part 210 passes through the band pass filtering part 220 and the residual current eliminating part 230, the residual current is finally eliminated and then outputted to the output part 300, is shown in FIG. 6. As shown in FIG. 6, it can be seen that the value of the residual current of the final pulse after the residual current is eliminated while passing through the band pass filtering part 220 and the residual current eliminating part 230 is about 45 mA, which is considerably less than the preset threshold current of 1 A.

As described above, referring to FIG. 4 to FIG. 6, when applying the band antenna EMP filter apparatus 10 according to the embodiment of the present disclosure, it can be seen that the HEMP introduced through the input part 100 is effectively eliminated so that the RF signal received through the antenna is transmitted to the output part 300 without distortion.

Figure 7:
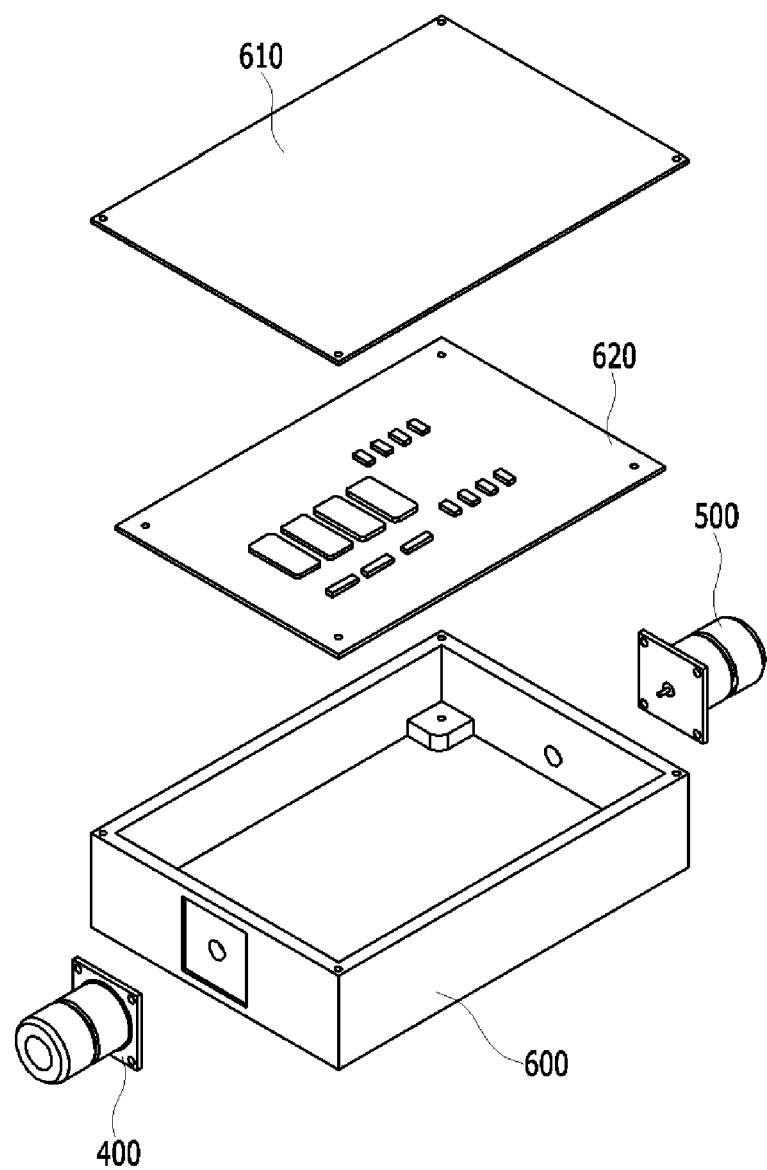
FIG. 7 illustrates a schematic exploded perspective view of a band antenna EMP filter apparatus according to an embodiment of the present disclosure.

Meanwhile, the band antenna EMP filter device 10 according to the embodiment of the present disclosure may be configured in a structure as shown in FIG. 7 for the HEMP protection of the conductive path as well as the HEMP protection of the radiant path as described above.

FIG. 7 illustrates a schematic exploded perspective view of the band antenna EMP filter apparatus 10 according to the embodiment of the present disclosure.

Referring to FIG. 7, an input part 400 and an output part 500 serve to receive and output an RF signal so that a signal is not lost by using a 50 ohm RF connector for impedance matching of 50 ohms. The functions of the input part 400 and the output part 500 are the same as those of the input part 100 and output part 300 described above.

A housing 600 is designed with a mounting structure considering a filter weight, and is designed with a structure that allows the inside of the housing to be opened and closed through a cover 610. The cover 610 is designed with a shielding structure in order to eliminate influence of the HEMP introduced from the outside through a space, which is the radiant path.

Meanwhile, a substrate 620 on which the circuit of the filter unit 200 as described with reference to FIG. 1 to FIG. 3 is mounted is mounted inside the housing 600 to be connected to the input part 400 and the output part 500. Accordingly, the cover 610 described above substantially serves as a shield to protect the circuit of the filter part 200 mounted on the substrate 620 mounted inside the housing 600 from the external HEMP.

In the case of the circuit of the filter part 200 mounted on the substrate 620, in order to minimize parasitic components, frequency characteristics (insertion loss, VSWR (voltage standing wave ratio)) are satisfied by using a leadless SMD (surface-mount device) type of MLCC (multilayer ceramic capacitor) and an air core inductor with a constant inductor value even at high frequencies. In addition, component specifications may be determined in consideration of the power and temperature characteristics used.

Figure 8:
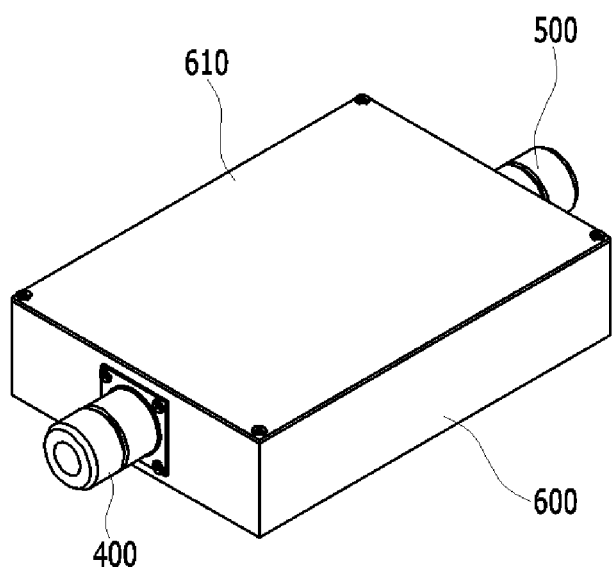
FIG. 8 illustrates a perspective view after the band antenna EMP filter apparatus shown in FIG. 7 is assembled.

The external shape of the band antenna EMP filter apparatus 10 according to the embodiment of the present disclosure in which the input part 400, the output part 500, and the housing 600 are all assembled is as shown in FIG. 8.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the

| <Description of Symbols> | |
|---|---|
| 10: band antenna EMP filter apparatus | |
| 100, 400: input parts | |
| 200: filter part | 300, 500: output parts |
| 210: primary discharging part | 220: band pass filtering part |
| 230: residual current eliminating part | 211: gas discharging tube |
| 221, 222, 223, 224: LC circuits | |
| 231, 232, 233: residual current eliminating circuits | |
| 600: housing | 610: cover |
| 620: substrate | |

What is claimed is:

1. An EMP filter apparatus, comprising:
a discharging part primarily discharging a transient voltage due to a high altitude electromagnetic pulse (HEMP) when the HEMP is inputted through an input part receiving a radio frequency (RF) signal of an antenna;
a band pass filtering part that secondarily blocks a residual current primarily discharged by the discharging part and passes only a signal of a preset frequency band to output it through an output part; and
a residual current eliminating part that limits a transient voltage of the HEMP by eliminating a residual current passing through the band pass filtering part,
wherein the band pass filtering part includes a band pass filter configured of a plurality of LC circuits disposed in series between the discharging part and the output part, and the plurality of LC circuits include,
 a first LC circuit connected to the discharging part,
 a second LC circuit connected to the first LC circuit, and
 a third LC circuit connected to the second LC circuit,
 each of the first LC circuit, the second LC circuit, and the third LC circuit is a circuit in which an inductor and a capacitor are connected in series.

2. The EMP filter apparatus of claim 1, wherein the discharging part, the band pass filtering part, and the residual current eliminating part are implemented on a substrate in a housing with a shielding structure to eliminate influence of a HEMP entering from the outside through a space that is a radiant path.

3. The EMP filter apparatus of claim 2, wherein capacitors included in the band pass filtering part and the residual current eliminating part are leadless surface-mount device (SMD) type of multilayer ceramic capacitors (MLCC) to minimize parasitic components, and inductors included therein are air core inductors with a constant inductor value even at high frequencies.

4. The EMP filter apparatus of claim 1, wherein
the residual current eliminating part includes a plurality of residual current eliminating circuits respectively connected between the plurality of LC circuits and the ground, and
the residual current eliminating circuit includes a first residual current eliminating circuit connected between a first connection point connecting the first LC circuit and the second LC circuit and the ground, and
a second residual current eliminating circuit connected between a second connection point connecting the second LC circuit and the third LC circuit and the ground.

5. The EMP filter apparatus of claim 4, wherein each of the plurality of residual current eliminating circuits includes:
a plurality of first high-speed switching diodes connected in series between a connection point between the plurality of LC circuits and the ground and a first capacitor connected between one of the plurality of first high-speed fast switching diodes and the ground; and
a plurality of second high-speed switching diodes connected in series between a connection point between the plurality of LC circuits and the ground and a second capacitor connected between one of the plurality of second high-speed fast switching diodes and the ground, and
the plurality of second high-speed switching diodes have opposite bias directions to the plurality of first high-speed switching diodes.

6. The EMP filter apparatus of claim 5, wherein the plurality of first high-speed switching diodes are turned on and operated when a positive HEMP is inputted to the plurality of LC circuits, and the plurality of second high-speed switching diodes are turned on and operated when a negative HEMP is inputted to the plurality of LC circuits, so that the transient voltage is limited so that a voltage applied to the plurality of LC circuits does not exceed a threshold voltage of the plurality of high-speed switching diodes.

7. The EMP filter apparatus of claim 5, wherein the first capacitor is disposed between the first high-speed switching diode and the ground to prevent output loss when an output of a threshold voltage or more is inputted to the plurality of first high-speed switching diodes, and the second capacitor is disposed between the second high-speed switching diode and the ground to prevent output loss when an output of a threshold voltage or more is inputted to the plurality of second high-speed switching diodes.

8. The EMP filter apparatus of claim 5, wherein each of the plurality of residual current eliminating circuits further includes an inductor and a capacitor connected in parallel between a connection point between the plurality of LC circuits and the ground.

9. The EMP filter apparatus of claim 5, wherein the first high-speed switching diode and the second high-speed switching diode are low leakage current type of diodes in a unit of pF or less, and the first capacitor and the second capacitor are high-capacity capacitors in a unit of uF.

10. The EMP filter apparatus of claim 1, wherein the discharging part primarily limits the transient current by discharging a transient voltage due to the HEMP by using a gas discharging tube.

\* \* \* \* \*